United States Patent
Kobayashi et al.

(10) Patent No.: US 9,738,969 B2
(45) Date of Patent: Aug. 22, 2017

(54) FILM-FORMING APPARATUS AND FILM-FORMING METHOD

(71) Applicant: Sony Corporation, Tokyo (JP)

(72) Inventors: Toshiyuki Kobayashi, Kanagawa (JP); Keisuke Shimizu, Kanagawa (JP); Koji Kadono, Kanagawa (JP); Yukiko Mizuguchi, Tokyo (JP); Yosuke Murakami, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/402,244

(22) PCT Filed: Apr. 24, 2013

(86) PCT No.: PCT/JP2013/002772
§ 371 (c)(1),
(2) Date: Nov. 19, 2014

(87) PCT Pub. No.: WO2013/179561
PCT Pub. Date: Dec. 5, 2013

(65) Prior Publication Data
US 2015/0140212 A1 May 21, 2015

(30) Foreign Application Priority Data
May 31, 2012 (JP) .................................. 2012-124321

(51) Int. Cl.
*C23C 16/458* (2006.01)
*C23C 14/56* (2006.01)
(Continued)

(52) U.S. Cl.
CPC .......... *C23C 14/562* (2013.01); *B65H 20/02* (2013.01); *C23C 14/0605* (2013.01);
(Continued)

(58) Field of Classification Search
None
See application file for complete search history.

(56) References Cited

U.S. PATENT DOCUMENTS 5,130,170 A * 7/1992 Kanai ..................... C23C 16/50
  136/258
5,273,911 A * 12/1993 Sasaki .................. C23C 14/568
  136/244
(Continued)

FOREIGN PATENT DOCUMENTS

EP  0 388 811  9/1990
EP  1 881 087  1/2008
(Continued)

OTHER PUBLICATIONS

English translation of WO2011/115197. Translation provided in GB1319526.8.*
(Continued)

*Primary Examiner* — Joseph Miller, Jr.
(74) *Attorney, Agent, or Firm* — Chip Law Group (57) ABSTRACT

There is provided a film-forming apparatus including a roll-to-roll mechanism and a heating unit. The roll-to-roll mechanism is configured to transport a film-forming target and includes a tensile force relaxation unit configured to relax a tensile force applied to the transported film-forming target. The heating unit is configured to heat the film-forming target transported by the roll-to-roll mechanism.

8 Claims, 7 Drawing Sheets

(51) Int. Cl.
- *C23C 16/02* (2006.01)
- *C23C 16/26* (2006.01)
- *C23C 16/46* (2006.01)
- *C23C 16/54* (2006.01)
- *B65H 20/02* (2006.01)
- *C23C 16/52* (2006.01)
- *C23C 14/06* (2006.01)
- *C23C 14/24* (2006.01)
- *C23C 14/54* (2006.01)

(52) U.S. Cl.
CPC ............... *C23C 14/24* (2013.01); *C23C 14/54* (2013.01); *C23C 16/0209* (2013.01); *C23C 16/26* (2013.01); *C23C 16/458* (2013.01); *C23C 16/46* (2013.01); *C23C 16/52* (2013.01); *C23C 16/545* (2013.01); *B65H 2301/5143* (2013.01); *B65H 2301/51145* (2013.01); *B65H 2404/143* (2013.01); *B65H 2511/112* (2013.01); *B65H 2513/11* (2013.01); *B65H 2515/31* (2013.01); *B65H 2553/412* (2013.01); *B65H 2701/173* (2013.01)

(56) References Cited

U.S. PATENT DOCUMENTS

| | | | | |
|---|---|---|---|---|
| 6,054,018 | A | * | 4/2000 | Denes ................ C23C 16/50 118/719 |
| 2010/0038468 | A1 | * | 2/2010 | Hein .................. B65H 23/0204 242/419.8 |
| 2011/0195207 | A1 | | 8/2011 | Hong et al. |
| 2013/0052119 | A1 | | 2/2013 | Kim et al. |

FOREIGN PATENT DOCUMENTS

| | | |
|---|---|---|
| EP | 1 964 799 | 9/2008 |
| JP | 2011-162877 | 8/2011 |
| WO | 2011/115197 | 9/2011 |

OTHER PUBLICATIONS

International Search Report issued in connection with International Patent Application No. PCT/JP2013/002772, dated Jul. 16, 2013. (3 pages).

\* cited by examiner

FILM-FORMING APPARATUS AND FILM-FORMING METHOD

CROSS REFERENCES TO RELATED APPLICATIONS

The present application is a national stage of International Application No. PCT/JP2013/002772 filed on Apr. 24, 2013 and claims priority to Japanese Patent Application No. 2012-124321 filed on May 31, 2012, the disclosure of which is incorporated herein by reference.

BACKGROUND

The present disclosure relates to a film-forming apparatus and a film-forming method that use a roll-to-roll system.

A film-forming process using a roll-to-roll system is for transporting a film-forming target (metallic foil or the like) by winding the film-forming target from an unwinding roll to a winding roll and for forming a thin film on the film-forming target during the transport. The roll-to-roll system allows a large-sized film-forming target to be transported, which is suitable for mass production of thin films.

For example, Patent Literature 1 discloses "a graphene roll-to-roll coating apparatus" that transports a metallic member by a roll-to-roll system and forms a graphene film on the metallic member.

CITATION LIST

Patent Literature

[PTL 1]
Japanese Patent Application Laid-open No. 2011-162877

SUMMARY

Technical Problem

However, in the film-forming process using the roll-to-roll system as described in Patent Literature 1, there may be a case where a film quality is deteriorated due to a tensile force applied to a film-forming target by the roll-to-roll system, as compared to a film-forming process in which the roll-to-roll system is not used.

In view of the circumstances as described above, it is desirable to provide a film-forming apparatus and a film-forming method that are capable of producing a high-quality thin film by using a roll-to-roll system.

Solution to Problem

According to an embodiment of the present disclosure, there is provided a film-forming apparatus including a roll-to-roll mechanism and a heating unit.

The roll-to-roll mechanism is configured to transport a film-forming target and includes a tensile force relaxation unit configured to relax a tensile force applied to the transported film-forming target.

The heating unit is configured to heat the film-forming target transported by the roll-to-roll mechanism.

With this configuration, the tensile force applied to the film-forming target is relaxed by the roll-to-roll mechanism. Therefore, it is possible to prevent a film quality from being deteriorated due to deformation (plastic deformation and twinning deformation) of the film-forming target by the tensile force.

The tensile force relaxation unit may include a pinch roll configured to sandwich the film-forming target.

With this configuration, it is possible to prevent the tensile force associated with winding and unwinding of the film-forming target by the roll-to-roll mechanism from being directly applied to the film-forming target by the pinch roll sandwiching the film-forming target, that is, to relax the tensile force applied to the film-forming target.

The pinch roll may include a guide roll configured to guide transport of the film-forming target and an elastic roll having a roll surface made of an elastic material, and the elastic roll may be pushed by the guide roll such that the film-forming target is sandwiched between the elastic roll and the guide roll.

With this configuration, by a frictional force of the elastic roll that rotates in conjunction with the guide roll, sliding of the film-forming target with respect to the guide roll is prevented, and the tensile force associated with winding and unwinding of the film-forming target by the roll-to-roll mechanism can be prevented from being directly applied to the film-forming target.

The tensile force relaxation unit may include a multiple-stage roll including a plurality of rolls.

With this configuration, it is possible to gradually relax the tensile force applied to the film-forming target by the multiple-stage roll. In the case where the tensile force of the film-forming target is relaxed at one spot, there is a fear that a large gradient of the tensile force is caused at that spot and the film-forming target slides, for example. According to this configuration, such a large gradient of the tensile force can be prevented.

The film-forming apparatus may further include a slack detection sensor configured to detect an amount of slack of the film-forming target. The tensile force relaxation unit may be configured to adjust the tensile force applied to the film-forming target in accordance with an output of the slack detection sensor.

With this configuration, the slack detection sensor can detect an amount of slack of the film-forming target, the slack being caused by relaxation of the tensile force applied to the film-forming target. The tensile force relaxation unit can adjust the tensile force applied to the film-forming target in accordance with the amount of slack of the film-forming target so that the tensile force can fall within an appropriate range.

The tensile force relaxation unit may be configured to relax the tensile force applied to the film-forming target to be equal to or smaller than a tensile force at which twinning deformation occurs in the film-forming target.

A specific metal species (copper or the like) causes twinning deformation when a tensile force is applied in a state of being heated. In the twinning deformation, the orientation of crystal is partially changed in metal crystal. The inventors of the present disclosure have found that the twinning deformation also occurs at a tensile force smaller than that of plastic deformation and the twinning deformation also inversely affects a film quality. Therefore, the tensile force relaxation unit relaxes the tensile force applied to the film-forming target to be a tensile force or lower, at which twinning deformation occurs in the film-forming target. Thus, the film quality can be prevented from being deteriorated due to the twinning deformation.

The film-forming target may include a metallic foil containing copper, and the tensile force relaxation unit may be configured to relax the tensile force applied to the film-forming target to be smaller than 1 MPa.

Heated copper (for example, 950 degrees) causes plastic deformation at a tensile force of about 8.3 MPa. However, the twinning deformation also occurs at a further lower tensile force of about 1 MPa. Therefore, in the case where the film-forming target is a metallic foil containing copper (including copper alloy), a tensile force applied to the film-forming target is relaxed to smaller than 1 MPa (more desirably, smaller than 0.1 MPa). Thus, the deterioration of the film quality due to the twinning deformation of copper can be suppressed.

The film-forming apparatus may further include a film-forming material supply unit configured to supply a carbon source substance containing carbon to the film-forming target heated by the heating unit.

When a carbon source substance (methane or the like) is supplied to a heated film-forming target (metallic foil containing copper), the carbon source substance is discomposed and a graphene film is formed on the film-forming target. It has been found that twinning deformation of copper may occur as described above at a graphene production temperature (for example, 950 degrees) and when the twinning deformation occurs, the quality of a graphene film (electric characteristics or the like) is lowered. In the present disclosure, as described above, the tensile force applied to the film-forming target is relaxed so that the twinning deformation of copper is prevented from occurring. Therefore, the deterioration of the quality of a graphene film due to the twinning deformation of copper can be prevented, and thus high-quality graphene can be produced.

According to another embodiment of the present disclosure, there is provided a film-forming method including: setting a film-forming target in a roll-to-roll mechanism; transporting the film-forming target by the roll-to-roll mechanism; supplying a film-forming material to the film-forming target; and heating the film-forming target in a state in which a tensile force applied to the film-forming target is relaxed by the roll-to-roll mechanism.

According to the film-forming method, the film-formation is performed in a state where the tensile force applied to the film-forming target is relaxed by the transport of the film-forming target by the roll-to-roll mechanism. Therefore, the deterioration of a film quality due to deformation of the film-forming target can be prevented, and thus a high-quality thin film can be produced.

The heating the film-forming target may be performed after transport of the film-forming target by the roll-to-roll mechanism is stopped and the tensile force is relaxed.

With this configuration, the transport of the film-forming target by the roll-to-roll mechanism is stopped, and thus a tensile force applied to the film-forming target by the transport can be relaxed.

Advantageous Effects of Invention

As described above, according to the present disclosure, it is possible to provide a film-forming apparatus and a film-forming method that are capable of producing a high-quality thin film by using a roll-to-roll system.

Additional features and advantages are described herein, and will be apparent from the following Detailed Description and the figures.

DETAILED DESCRIPTION

First Embodiment

Figure 1:
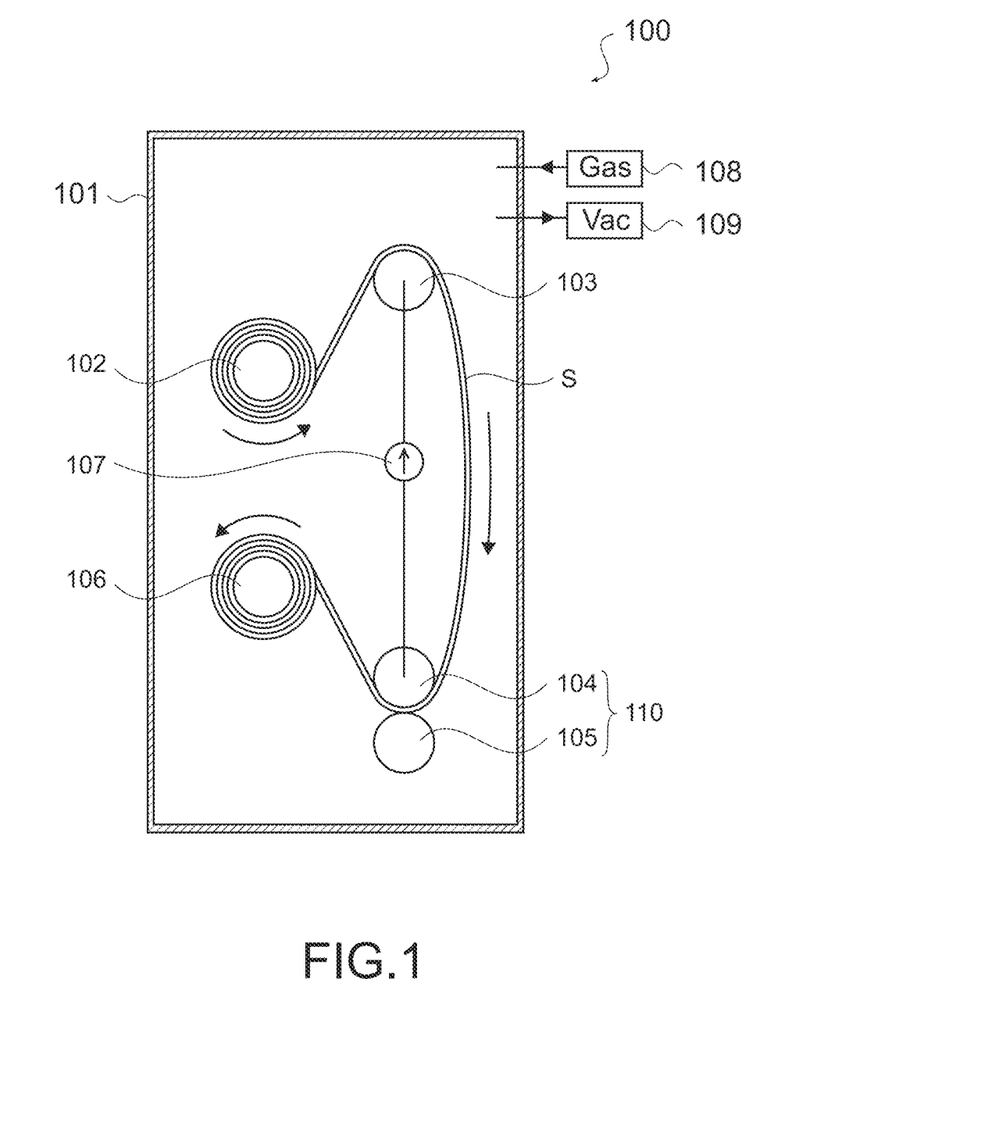
FIG. 1 is a schematic diagram showing a configuration of a film-forming apparatus according to a first embodiment of the present disclosure.

Description will be given on a film-forming apparatus according to a first embodiment of the present disclosure. FIG. 1 is a schematic diagram showing a film-forming apparatus 100 according to the first embodiment of the present disclosure. It should be noted that the film-forming apparatus 100 according to this embodiment is assumed to be a film-forming apparatus to form a graphene film on a film-forming target.

As shown in FIG. 1, the film-forming apparatus 100 includes a chamber 101, a unwinding roll 102, a first guide roll 103, a second guide roll 104, an elastic roll 105, a winding roll 106, a current source 107, a gas supply system 108, and a vacuum evacuation system 109. The unwinding roll 102, the first guide roll 103, the second guide roll 104, the elastic roll 105, and the winding roll 106 constitute a roll-to-roll mechanism. The roll-to-roll mechanism and the current source 107 are housed in the chamber 101, and the gas supply system 108 and the vacuum evacuation system 109 are connected to the chamber 101. Further, a film-forming target S is set in the roll-to-roll mechanism.

The chamber 101 houses the roll-to-roll mechanism and the current source 107 and also provides a film-forming atmosphere. The chamber 101 can be a vacuum chamber that can maintain a vacuum state therein, for example. However, any chamber can be selected in accordance with film-forming conditions.

The unwinding roll 102 is a roll from which the film-forming target S is unwound. The unwinding roll 102 adjusts a tensile force of the film-forming target S from a pinch roll 110 (to be described later) to the unwinding roll 102. The unwinding roll 102 can be rotatably driven by a drive source (motor or the like) (not shown). The tensile force of the film-forming target S can be adjusted by the unwinding roll 102 through transmission of a drive force from the drive source by clutch control, or the like.

The first guide roll 103 guides the transport of the film-forming target S and also applies a current supplied from the current source 107 to the film-forming target S. The first guide roll 103 can be connected to a drive source (not shown) and rotatably driven. The first guide roll 103 can be made of a material having conductivity, such as metal.

The second guide roll 104 guides the transport of the film-forming target S and also applies a current supplied from the current source 107 to the film-forming target S. The second guide roll 104 can be connected to a drive source (not shown) and rotatably driven. The second guide roll 104 can be made of a material having conductivity, such as metal.

The elastic roll 105 is pushed by the second guide roll 104 and sandwiches the film-forming target S together with the second guide roll 104. The elastic roll 105 is made of an elastic material in which at least the surface thereof (roll surface) has elasticity. This elasticity prevents the film-forming target S from sliding with respect to the second guide roll 104. The elastic material can be silicon, for example.

The second guide roll 104 and the elastic roll 105 constitute the pinch roll 110, with which the film-forming target S transported by the roll-to-roll mechanism is sandwiched.

The winding roll 106 is a roll with which the film-forming target S is wound. The winding roll 106 adjusts a tensile force of the film-forming target S from the pinch roll 110 to the winding roll 106. The winding roll 106 can be rotatably driven by a drive source (motor or the like) (not shown). The tensile force of the film-forming target S can be adjusted by the winding roll 106 through transmission of a drive force from the drive source by clutch control, or the like.

The current source 107 is connected to the first guide roll 103 and the second guide roll 104 and applies a current between the first guide roll 103 and the second guide roll 104. Thus, a current flows in an area of the film-forming target S between the first guide roll 103 and the second guide roll 104 (hereinafter, referred to as film-forming area) so that the film-forming target S is resistance-heated.

It should be noted that the film-forming target S may be heated by a method different from resistance heating. In this case, the current source 107 may not be provided. Examples of a heating method different from the resistance heating include heating by a ceramic heater, a halogen lamp, and application of a laser or the like, heating by an induced current by application of a magnetic field, and heating by heat conduction.

In the case where the film-forming target S is heated by a heating method different from the resistance heating, the first guide roll 103 and the second guide roll 104 are not necessarily made of a material having conductivity and can be made of plastic, ceramic, or the like.

The gas supply system 108 supplies a carbon source gas serving as a film-forming material into the chamber 101. The gas supply system 108 includes a gas source (gas cylinder or the like) (not shown) and is configured to supply gas into the chamber 101. The gas supply system 108 can supply methane as the carbon source gas, for example.

It should be noted that instead of supplying the carbon source gas from the gas supply system 108, a substance including a carbon source substance may be supplied into the chamber 101 by another method. For example, liquid (ethanol or the like) containing a carbon source substance may be housed in the chamber 101, and vapor of such liquid may be supplied into the chamber 101. Alternatively, a solid (PMMA (Poly(methyl methacrylate) or the like) containing a carbon source substance may be supported on the film-forming target S in advance and then heated together with the film-forming target S. Alternatively, in the case where the chamber 101 is heated, such a solid may be housed in the chamber 101 and then vaporized.

The vacuum evacuation system 109 evacuates the chamber 101. The vacuum evacuation system 109 includes a vacuum pump and the like (not shown) and is configured to evacuate the chamber 101.

The film-forming apparatus 100 has the configuration as described above.

(Film-Forming Target)

As described above, the film-forming target S is set in the roll-to-roll mechanism of the film-forming apparatus 100. The film-forming target S can be made of a metallic foil and appropriately selected depending on catalytic activity, film-forming conditions, and the like. However, a material containing copper (including copper alloy) is suitable for the film-forming target S. This is because copper has catalytic activity with respect to the film-formation of graphene and has properties that carbon does not blend thereinto. Further, copper can be removed by an etchant (iron chloride or the like) and is suitable when generated graphene is transferred to another substance (copper is eliminated). Additionally, copper is relatively inexpensive.

In addition, the film-forming target S can be a foil made of pure metal such as platinum (Pt), nickel (Ni), and cobalt (Co) or of an alloy such as a copper-nickel alloy. For example, an alloy in which platinum having a high catalytic function is added to copper, an alloy in which zirconium (Zr) of 0.02 weight percent is added to copper in order to make it hard to cause plastic deformation, an alloy in which chromium (Cr), tin (Sn), and zinc (Zn) of 0.25 weight percent each are added to copper, and the like can be used for the film-forming target S. Further, as described above, in the case where the film-forming target S is heated by the resistance heating, its electric resistance is also taken into consideration.

Various types of metal including copper cause plastic deformation when a tensile force is applied thereto in a heated state. When the film-forming target S is deformed, the quality of a thin film to be formed on the film-forming target S may be deteriorated. Therefore, it is necessary to prevent the film-forming target S from being deformed. In particular, in the roll-to-roll mechanism, a tensile force is applied to the film-forming target along with the transport, and therefore it is necessary to relax the tensile force.

Further, in the case where a material containing copper is used as the film-forming target S, there is a fear that "twinning deformation" occurs in copper at a temperature at which graphene is produced (for example, 950 degrees) (hereinafter, referred to as graphene production temperature). The twinning deformation is deformation that occurs due to a partial change of a crystalline orientation in metallic crystal and that occurs at a tensile force lower than that of plastic deformation. For example, in the case of copper, the plastic deformation occurs at an applied tensile force of about 8.3 Pa (950 degrees), but the twinning deformation can occur even at an applied tensile force of about 1 MPa.

The inventors of the present disclosure have found that in the case where a graphene film is formed on the film-forming target S made of a material containing copper, the quality of graphene (electric characteristics or the like) is lowered due to the twinning deformation of copper. In this embodiment, a tensile force applied to the film-forming target S by the roll-to-roll mechanism is relaxed, and the plastic deformation and twinning deformation of the film-forming target S are prevented from occurring, which can prevent the quality of a thin film from being deteriorated due to the deformation of the film-forming target.

The thickness of the metallic foil used as the film-forming target S is not particularly limited, and can be desirably set to 1 to 100 um, and more desirably 10 to 50 um. The width and the length of the metallic foil (length of film-forming area (to be described later)) are also not particularly limited. For example, the width and the length can be set to 10 to 10000 mm. More desirably, the width can be set to 50 to 2000 mm and the length to 100 to 2000 mm. A transport direction of the film-forming target S (extension direction of film-forming area (to be descried later)) is also not particularly limited and can be set to a vertical direction, a horizontal direction, or an oblique direction.

(Film-Forming Methods)

(Film-Forming Method 1)

Description will be given on a film-forming method (film-forming method 1) using the film-forming apparatus 100. As shown in FIG. 1, the film-forming target S is set in the roll-to-roll mechanism. Specifically, the rolled film-forming target S is attached to the unwinding roll 102, and an end of the film-forming target S is connected to the winding roll 106 via the first guide roll 103 and the pinch roll 110 (second guide roll 104 and elastic roll 105). The film-forming target S is sandwiched by the pinch roll 110.

After the film-forming target S is set, an adjustment is made such that the inside of the chamber 101 is suited for a film-formation environment. Specifically, the chamber 101 can be evacuated by the vacuum evacuation system 109.

Subsequently, a carbon source gas is introduced into the chamber 101 from the gas supply system 108. The carbon source gas can be methane gas and hydrogen gas, for example. A flow rate of the carbon source gas can be 400 sccm of methane gas and 50 sccm of hydrogen gas, for example. The carbon source gas can be adjusted such that the pressure in the chamber 101 is set to 0.001 to 120 kPa, for example.

Subsequently, the current source 107 applies a current to the film-forming target S via the first guide roll 103 and the second guide roll 104 so that the film-forming area of the film-forming target S is resistance-heated. The heating temperature is not particularly limited and may be the graphene production temperature or higher (for example, 950 degrees). By the heating, the carbon source gas supplied to the film-forming target S is discomposed, and a graphene film is formed on the film-forming target S at the same time.

Along with the formation of the graphene film, the film-forming target S is transported by the roll-to-roll mechanism. Specifically, the unwinding roll 102 and the winding roll 106 are rotated, and the film-forming target S is unwound from the unwinding roll 102 and wound by the winding roll 106. Further, the first guide roll 103 and the pinch roll 110 are rotated, and the film-forming target S is transported from the first guide roll 103 to the pinch roll 110.

Along with the transport of the film-forming target S, the film-forming target S is sequentially supplied to the film-forming area so that a thin graphene film is formed. For example, when a current of 8 kA/cm$^2$ is applied to the film-forming area of the copper foil by the current source 107, the copper foil having the width of 230 mm and being transported by the roll-to-roll mechanism at 0.1 m/min, about 200 mm of the film-forming area having the length of 400 mm is heated to 1000 degrees. When methane gas comes into contact with the copper surface having this temperature, methane is discomposed by a catalytic action of copper, and thus graphene is produced. It should be noted that the coverage of the copper foil by graphene is not particularly limited, and grains (crystal fragments) may not be connected to one another.

During the film-formation, the copper foil is held by the pinch roll 110 so that a larger tensile force can be applied to the winding roll 106 side of the film-forming target S than the pinch roll 110 side of the film-forming target S and the film-forming target S can be wound without loose (firmly). On the other hand, a tensile force is reduced on the unwinding roll 102 side of the film-forming target S than the pinch roll 110 side of the film-forming target S so that the tensile force in the film-forming area can be reduced.

In order to prevent the twinning deformation from occurring, the tensile force applied to the film-forming target S is suitably set to be smaller than 1 MPa, and particularly, set to 0.1 MPa or smaller. The tensile force in this case is considerably smaller than the tensile force at which the plastic deformation described above occurs (in the case of copper, 8.3 Pa at 950 degrees).

The relaxation of the tensile force applied to the film-forming target S is allowed when the tensile force for winding by the winding roll 106 and the tensile force in the film-forming area are separated from each other by the pinch roll 110 sandwiching the film-forming target S.

The tensile force applied to the film-forming target S is relaxed, which makes it possible to prevent deformation (plastic deformation and twinning deformation) of the film-forming target S and provide high-quality graphene to be formed on the film-forming target S.

(Film-Forming Method 2)

Description will be given on a film-forming method (film-forming method 2) using the film-forming apparatus 100. As in the case of the film-forming method 1 described above, a film-forming target S is set in the roll-to-roll mechanism (see FIG. 1). After the film-forming target S is set, an adjustment is made such that the inside of the chamber 101 is suited for a film-formation environment as described above. Then, a carbon source gas is introduced from the gas supply system 108.

After the film-forming target S is transported by the roll-to-roll mechanism, the roll-to-roll mechanism is stopped. Thus, a tensile force applied to the film-forming target S is relaxed. Further, after the roll-to-roll mechanism is stopped, it is also possible to slightly rotate the pinch roll 110 (second guide roll 104 and elastic roll 105) in the opposite direction to relax the tensile force applied to the film-forming target S.

After that, the film-forming area of the film-forming target S is heated to a predetermined temperature. The carbon source gas is discomposed in the film-forming area by the heat of the film-forming target S, and a graphene film is formed on the film-forming target S at the same time. After the elapse of a predetermined period of time, the heating of the film-forming target S is stopped and the production of graphene is stopped.

After the production of graphene is stopped, the film-forming target S is transported by the roll-to-roll mechanism such that a new area of the film-forming target S is set as the film-forming area. Then, the tensile force is relaxed as described above. After the new area is heated and graphene is produced, the heating is stopped. After that, the transport of the film-forming target S by the roll-to-roll mechanism, the relaxation of the tensile force, and the production of graphene are repeated in the stated order.

By such a film-forming method, the tensile force applied to the film-forming target S is relaxed, which makes it possible to prevent the deformation (plastic deformation and twinning deformation) of the film-forming target S and provide high-quality graphene to be formed on the film-forming target S.

Effects of this Embodiment

Figure 2:
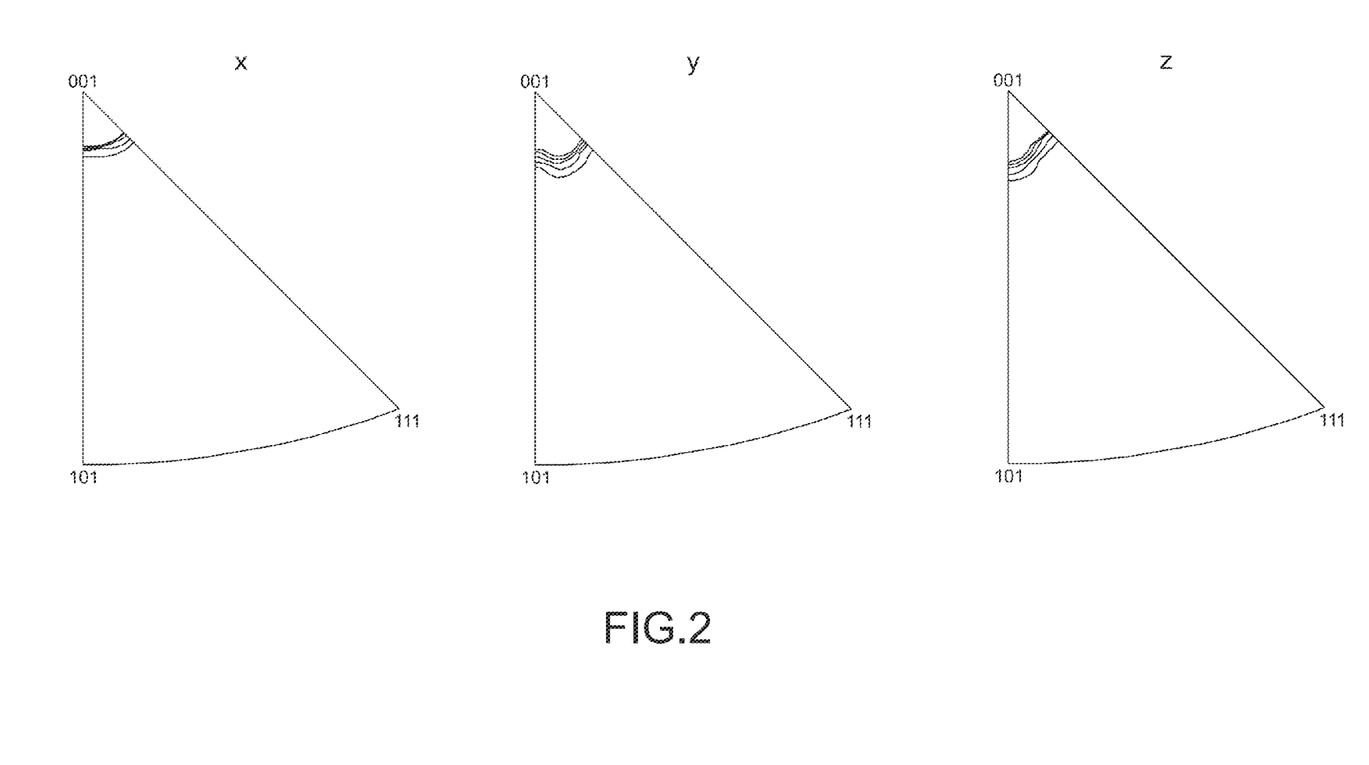
FIG. 2 is an inverse pole figure showing a crystalline orientation distribution of a copper foil that is heated in a state of being applied with a low tensile force (0.1 MPa).
Figure 3:
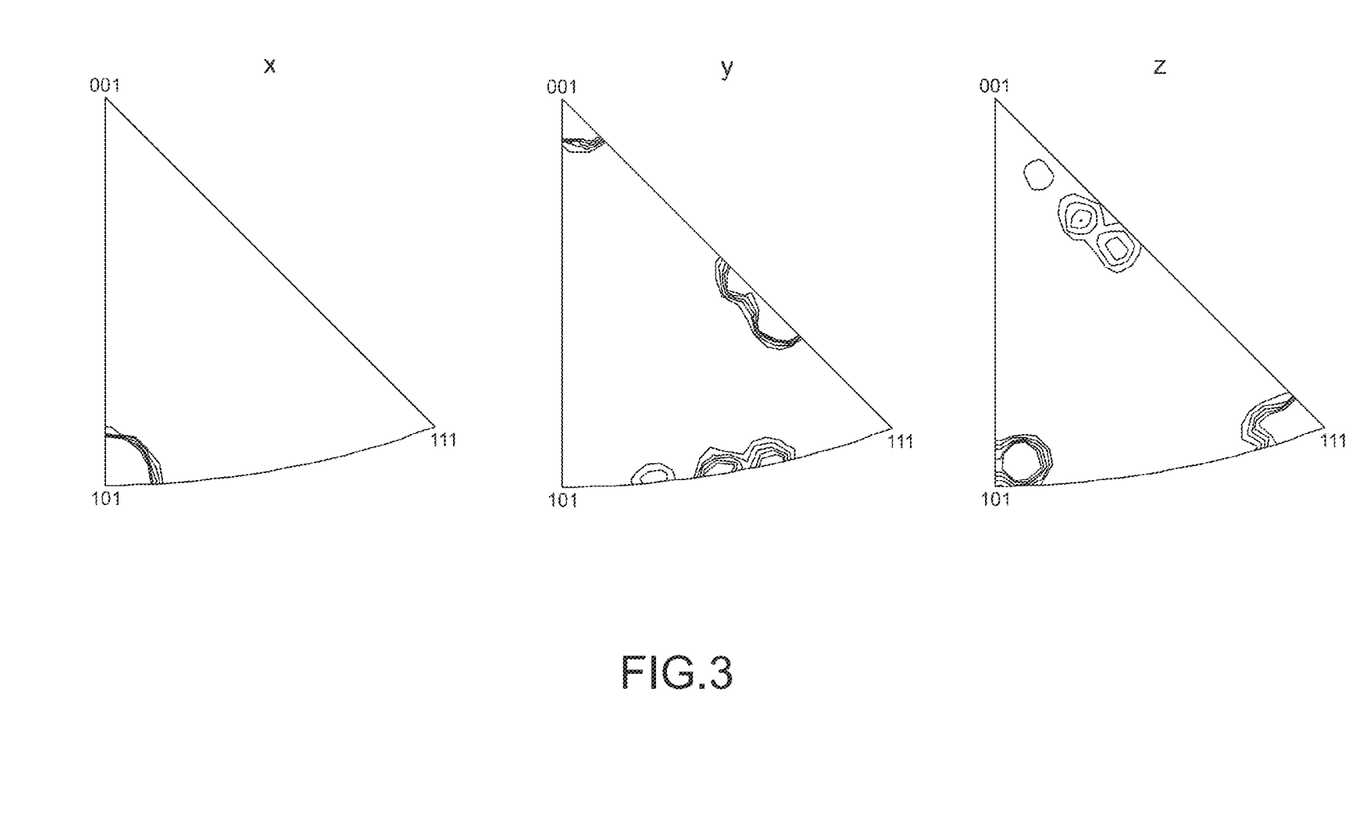
FIG. 3 is an inverse pole figure showing a crystalline orientation distribution of a copper foil that is heated in a state of being applied with a high tensile force (1 MPa).

As described above, since the tensile force applied to the film-forming target S is relaxed in this embodiment, the twinning deformation of the film-forming target S is prevented. FIG. 2 and FIG. 3 each show measured results of a crystalline orientation distribution of a copper foil by EBSD (electron backscatter diffraction). FIG. 2 shows measured results of a copper foil that is heated in a state of being applied with a low tensile force (0.1 MPa). FIG. 3 shows measured results of a copper foil that is heated in a state of being applied with a high tensile force (1 MPa).

As shown in FIG. 2, it is found that in the case where the copper foil is heated in a state of being applied with a low tensile force, the crystal structure of copper has the orientation in the <001> direction, which is the same as that before heating, in each of X, Y, and Z directions. On the other hand, as shown in FIG. 3, in the case where the copper foil is heated in a state of being applied with a high tensile force, twin boundaries are found in the crystal structure of the copper, and therefore it is found that twinning deformation occurs. It is found that the orientation in the [101] direction is maintained and the crystal is rotated with the <101> direction as a rotation axis. In other words, it is found from FIG. 2 and FIG. 3 that the relaxation of the tensile force applied to the copper foil leads to prevention of the twinning deformation. It should be noted that the twinning deformation occurs at a tensile force sufficiently lower than that of plastic deformation. Therefore, the plastic deformation is not problematic at a low tensile force at which the twinning deformation does not occur.

Figure 4:
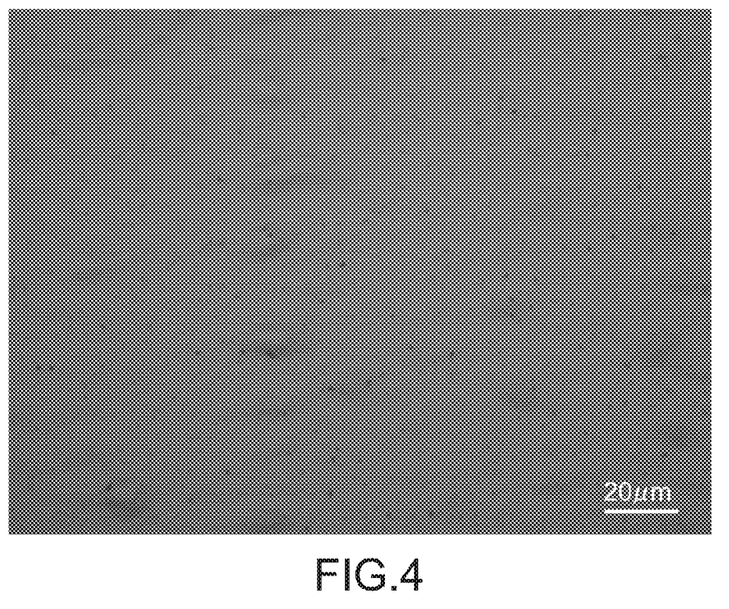
FIG. 4 is an optical microscope image of a graphene film formed on the copper foil applied with the low tensile force (0.1 MPa).
Figure 5:
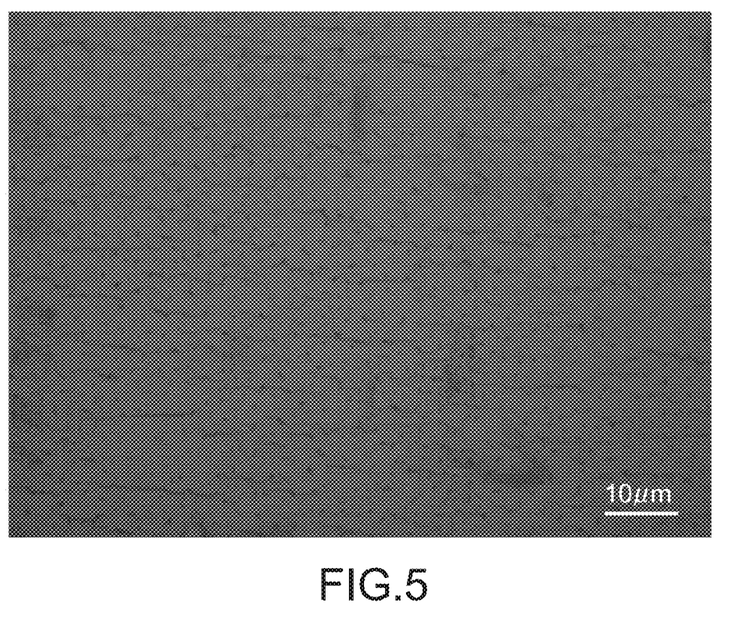
FIG. 5 is an optical microscope image of a graphene film formed on the copper foil applied with the high tensile force (1 MPa).

FIG. 4 and FIG. 5 each show an optical microscope image of graphene formed on the copper foil. FIG. 4 shows a graphene film formed on the copper foil applied with a low tensile force (0.1 MPa). FIG. 5 shows a graphene film formed on the copper foil applied with a high tensile force (1 MPa). It is found that in FIG. 4, a graphene film is uniformly formed, and in FIG. 5, however, cracks are generated on the graphene film. In other words, it can be said that the relaxation of the tensile force applied to the film-forming target S makes it possible to produce high-quality graphene.

Second Embodiment

Figure 6:
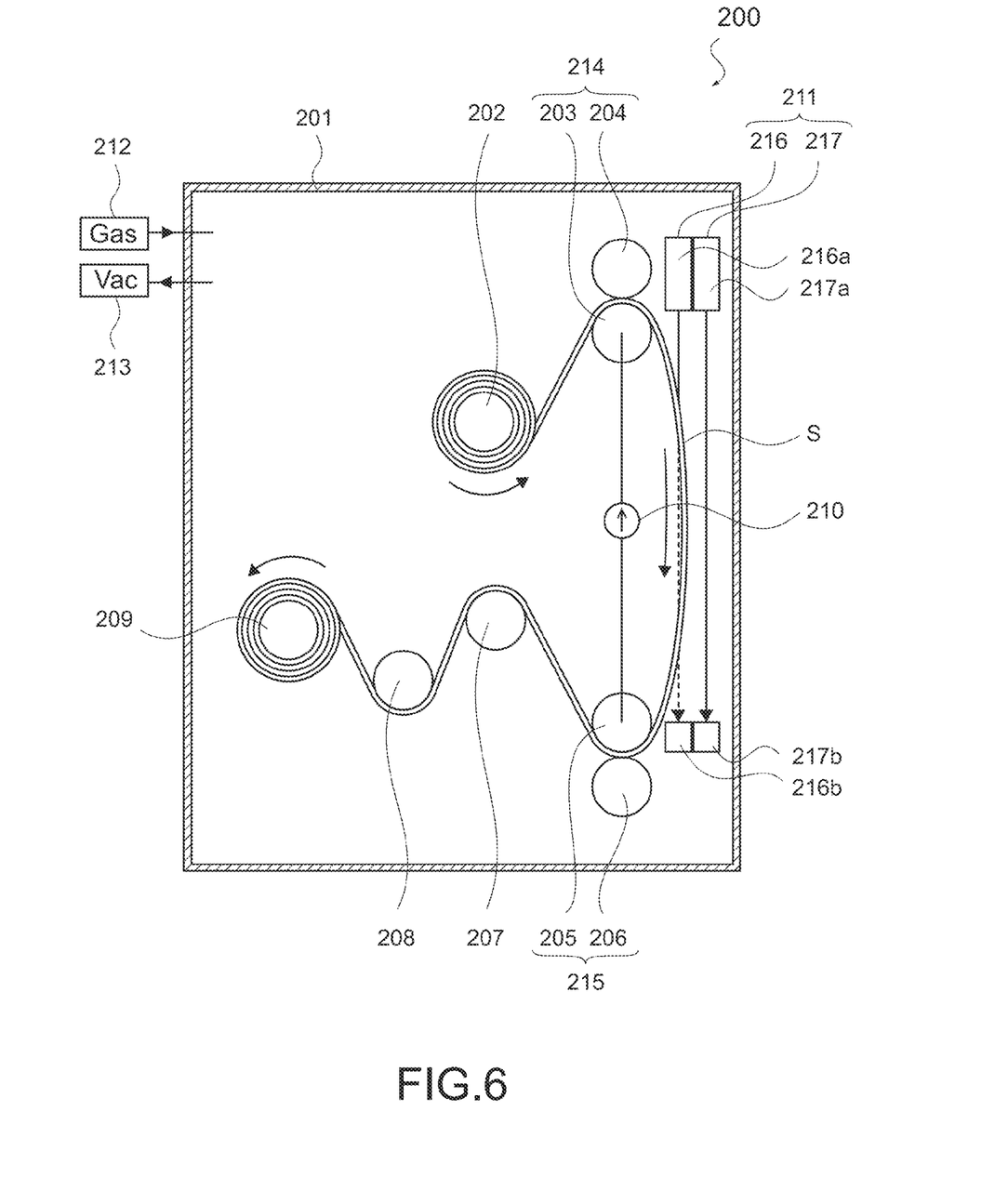
FIG. 6 is a schematic diagram showing a configuration of a film-forming apparatus according to a second embodiment of the present disclosure.

Description will be given on a film-forming apparatus according to a second embodiment of the present disclosure. FIG. 6 is a schematic diagram showing a film-forming apparatus 200 according to the second embodiment of the present disclosure. It should be noted that the film-forming apparatus 200 according to this embodiment is a film-forming apparatus that forms a graphene film on a film-forming target.

As shown in FIG. 6, the film-forming apparatus 200 includes a chamber 201, an unwinding roll 202, a first guide roll 203, a first elastic roll 204, a second guide roll 205, a second elastic roll 206, a third elastic roll 207, a fourth elastic roll 208, a winding roll 209, a current source 210, a slack detection sensor 211, a gas supply system 212, and a vacuum evacuation system 213.

The unwinding roll 202, the first guide roll 203, the first elastic roll 204, the second guide roll 205, the second elastic roll 206, the third elastic roll 207, the fourth elastic roll 208, and the winding roll 209 constitute a roll-to-roll mechanism. The roll-to-roll mechanism, the current source 210, and the slack detection sensor 211 are housed in the chamber 201, and the gas supply system 212 and the vacuum evacuation system 213 are connected to the chamber 201. Further, a film-forming target S is set in the roll-to-roll mechanism.

The chamber 201 houses the roll-to-roll mechanism and the current source 210 and also provides a film-forming atmosphere. The chamber 201 can be a vacuum chamber that can maintain a vacuum state therein, for example. However, any chamber can be selected in accordance with film-forming conditions.

The unwinding roll 202 is a roll from which the film-forming target S is unwound. The unwinding roll 102 adjusts a tensile force of the film-forming target S from a first pinch roll 214 (to be described later) to the unwinding roll 202. The unwinding roll 202 can be rotatably driven by a drive source (motor or the like) (not shown). The tensile force of the film-forming target S can be adjusted by the unwinding roll 202 through transmission of a drive force from the drive source by clutch control, or the like.

The first guide roll 203 guides the transport of the film-forming target S and also applies a current supplied from the current source 210 to the film-forming target S. The first guide roll 203 can be connected to a drive source (not shown) and rotatably driven. The first guide roll 203 can be made of a material having conductivity, such as metal.

The first elastic roll 204 is pushed by the first guide roll 203 and sandwiches the film-forming target S together with the first guide roll 203. The first elastic roll 204 is made of an elastic material in which at least the surface thereof (roll surface) has elasticity. This elasticity prevents the film-forming target S from sliding with respect to the first guide roll 203. The elastic material can be silicon, for example.

The first guide roll 203 and the first elastic roll 204 constitute the first pinch roll 214, with which the film-forming target S transported by the roll-to-roll mechanism is sandwiched.

The second guide roll 205 guides the transport of the film-forming target S and also applies a current supplied from the current source 210 to the film-forming target S. The second guide roll 205 can be connected to a drive source (not shown) and rotatably driven. The second guide roll 205 can be made of a material having conductivity, such as metal.

The second elastic roll 206 is pushed by the second guide roll 205 and sandwiches the film-forming target S together with the second guide roll 205. The second elastic roll 206 is made of an elastic material in which at least the surface thereof (roll surface) has elasticity. This elasticity prevents the film-forming target S from sliding with respect to the second guide roll 205. The elastic material can be silicon, for example.

The second guide roll 205 and the second elastic roll 206 constitute a second pinch roll 215, with which the film-forming target S transported by the roll-to-roll mechanism is sandwiched.

The third elastic roll 207 and the fourth elastic roll 208 are disposed between the second pinch roll 215 and the winding roll 209 to guide the film-forming target S from the second pinch roll 215 to the winding roll 209. The third elastic roll 207 and the fourth elastic roll 208 are each made of an elastic material in which at least the surface thereof (roll surface) has elasticity. The elastic material can be silicon, for example. Members whose rotational torque is adjustable by a clutch mechanism or the like are suitable for the third elastic roll 207 and the fourth elastic roll 208.

The winding roll 209 is a roll with which the film-forming target S is wound. The winding roll 209 adjusts a tensile force of the film-forming target S from the second pinch roll 215 to the winding roll 209. The winding roll 209 can be rotatably driven by a drive source (motor or the like) (not shown). The tensile force of the film-forming target S can be adjusted by the winding roll 209 through transmission of a drive force from the drive source by clutch control, or the like The current source 210 is connected to the first guide roll 203 and the second guide roll 205 and applies a current between the first guide roll 203 and the second guide roll 205. Thus, a current flows in an area of the film-forming target S between the first guide roll 203 and the second guide roll 205 so that the film-forming target S is resistance-heated. As in the case of the first embodiment, the film-forming target S can be heated by a heating method different from the resistance heating. In such a case, various types of heating sources can be provided instead of the current source 210.

The slack detection sensor 211 detects slack of the film-forming target S transported by the roll-to-roll mechanism. The slack detection sensor 211 can be provided with a first photosensor 216 and a second photosensor 217. The first photosensor 216 and the second photosensor 217 are each disposed such that emitted light (detected light) thereof is substantially parallel to the film-forming target S. The first photosensor 216 can be provided at a position close to the film-forming target S than the second photosensor 217.

The first photosensor 216 includes a light-emitting section 216a and a light-receiving section 216b. Light (laser light or the like) emitted from the light-emitting section 216a can be received by the light-receiving section 216b. In this embodiment, in the case where the light emitted from the light-emitting section 216a is received by the light-receiving section 216b, it can be determined that slack is not caused in the film-forming target S, that is, the tensile force of the film-forming target S is not relaxed. Further, in the case where the light emitted from the light-emitting section 216a is not received by the light-receiving section 216b, it can be determined that the emitted light is blocked by the film-forming target S, that is, slack is caused in the film-forming target S.

The second photosensor 217 includes a light-emitting section 217a and a light-receiving section 217b. Light (laser light or the like) emitted from the light-emitting section 217a can be received by the light-receiving section 217b. In this embodiment, in the case where the light emitted from the light-emitting section 217a is not received by the light-receiving section 217b, it can be determined that slack is excessively caused in the film-forming target S. Further, in the case where the light emitted from the light-emitting section 217a is received by the light-receiving section 217b, it can be determined that slack is not excessively caused in the film-forming target S.

In other words, based on the output of the slack detection sensor 211 (first photosensor 216 and second photosensor 217), whether the slack of the film-forming target S falls within an appropriate range (for example, 10 mm or smaller) can be acquired. It should be noted that the slack detection sensor 211 is not limited to a sensor using a photosensor as described herein, and any sensor may be used as long as it can detect slack of the film-forming target S.

For example, the slack detection sensor 211 may be a sensor that measures a resistance value of the film-forming area (area of the film-forming target S between the first pinch roll 214 and the second pinch roll 215) during the resistance heating. The resistance value depends on the length of the film-forming area. Further, the slack detection sensor 211 may be a sensor that includes an electrical contact point disposed at an allowable limit position of the slack of the film-forming target S and detects contact of this contact point with the film-forming target S in the case where slack is excessively caused in the film-forming target S. Further, the slack detection sensor 211 may be a sensor that captures an image of the film-forming area with use of an image sensor and detects slack of the film-forming target S by image recognition.

The gas supply system 212 supplies gas serving as a film-forming material into the chamber 201. The gas supply system 212 includes a gas source (gas cylinder or the like) (not shown) and is configured to supply a carbon source gas into the chamber 201. As in the case of the first embodiment, instead of the gas supply system 212, liquid or a solid containing the film-forming material can be housed in the chamber 201.

The vacuum evacuation system 213 evacuates the chamber 201. The vacuum evacuation system 213 includes a vacuum pump and the like (not shown) and is configured to evacuate the chamber 201.

The film-forming apparatus 200 has the configuration as described above. It should be noted that the film-forming target S can be a metallic foil made of copper or the like, as in the case of the first embodiment.

(Film-Forming Method)

Description will be given on a film-forming method using the film-forming apparatus 200. As shown in FIG. 6, the film-forming target S is set in the roll-to-roll mechanism. Specifically, the rolled film-forming target S is attached to the unwinding roll 202, and an end of the film-forming target S is connected to the winding roll 209 via the first pinch roll 214, the second pinch roll 215, the third elastic roll 207, and the fourth elastic roll 208. The film-forming target S is sandwiched by the first pinch roll 214 and by the second pinch roll 215.

After the film-forming target S is set, an adjustment is made such that the inside of the chamber 201 is suited for a film-formation environment. Specifically, the chamber 201 can be evacuated by the vacuum evacuation system 213.

Subsequently, a carbon source gas is introduced into the chamber 201 from the gas supply system 212. The carbon source gas can be methane gas and hydrogen gas, for example. A flow rate of the carbon source gas can be 400 sccm of methane gas and 50 sccm of hydrogen gas, for example. The carbon source gas can be adjusted such that the pressure in the chamber 201 is set to 0.001 to 120 kPa, for example.

Subsequently, the current source 210 applies a current to the film-forming target S via the first guide roll 203 and the second guide roll 205 so that the film-forming target S is resistance-heated. Here, the heated area of the film-forming target S is located between the first guide roll 203 and the second guide roll 205 (film-forming area). The heating temperature is not particularly limited and may be a graphene production temperature or higher (for example, 950 degrees).

When the film-forming target S is heated to the graphene production temperature or higher, the carbon source gas is discomposed by the heat of the film-forming target S in the film-forming area, and a graphene film is formed on the film-forming target S at the same time.

Along with the formation of the graphene film, the film-forming target S is transported by the roll-to-roll mechanism. Specifically, the unwinding roll 202 and the winding roll 209 are rotated, and the film-forming target S is unwound from the unwinding roll 202 and wound by the winding roll 209. Further, the first pinch roll 214 and the second pinch roll 215 are rotated, and the film-forming target S is transported from the first pinch roll 214 to the second pinch roll 215. In addition, the third elastic roll 207 and the fourth elastic roll 208 are also rotated, and the film-forming target S is guided to the winding roll 209.

Here, the rotational speed of the first pinch roll 214 or the second pinch roll 215 is adjusted, and thus a tensile force applied to the film-forming target S in the film-forming area can be relaxed. Specifically, based on the output from the slack detection sensor 211, the rotational speed of the first pinch roll 214 or the second pinch roll 215 can be adjusted such that slack of the film-forming target S falls within an appropriate rage.

Further, the third elastic roll 207 and the fourth elastic roll 208 can relax a high tensile force applied to firmly wind the film-forming target S by the winding roll 209. When a large gradient of the tensile force is generated at one spot of the second pinch roll 215, there arises a problem that sliding is caused between the film-forming target S and the second pinch roll 215, and the like. However, the tensile force is gradually relaxed between the winding roll 209 and the film-forming area by the third elastic roll 207 and the fourth elastic roll 208, and accordingly such a problem can be eliminated.

In order to prevent twinning deformation from occurring, the tensile force applied to the film-forming target S is suitably set to be smaller than 1 MPa, and particularly, set to 0.1 MPa or smaller. The tensile force in this case is considerably smaller than the tensile force at which the plastic deformation described above occurs (in the case of copper, 8.3 Pa at 950 degrees).

As described above, also in this embodiment, the tensile force applied to the film-forming target S is relaxed, which makes it possible to prevent deformation (plastic deformation and twinning deformation) of the film-forming target S and provide high-quality graphene to be formed on the film-forming target S.

The present disclosure is not limited to the embodiments described above and can be variously modified without departing from the gist of the present disclosure.

MODIFIED EXAMPLES

Description will be given on Modified Examples of the present disclosure.

Modified Example 1

Figure 7:
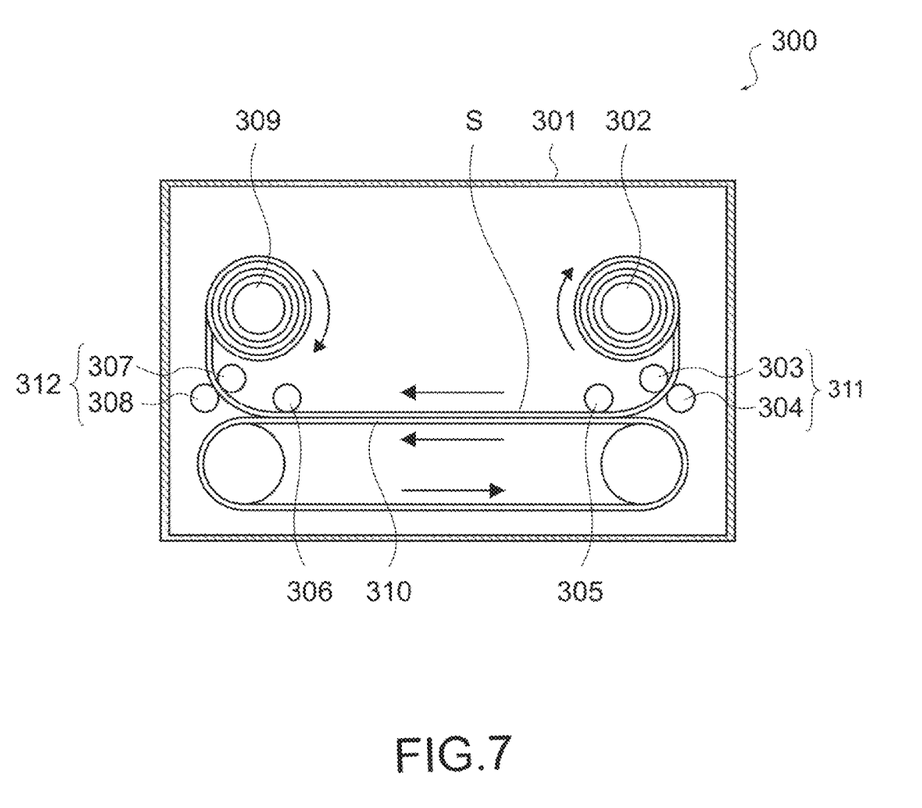
FIG. 7 is a schematic diagram showing a configuration of a film-forming apparatus according to Modified Example 1 of the present disclosure.

FIG. 7 is a schematic diagram showing a film-forming apparatus 300 according to Modified Example 1. As shown in FIG. 7, the film-forming apparatus 300 includes a chamber 301, an unwinding roll 302, a first guide roll 303, a first elastic roll 304, a second guide roll 305, a third guide roll 306, a fourth guide roll 307, a second elastic roll 308, a winding roll 309, and a transport belt 310. It should be noted that a gas supply system, a vacuum evacuation system, and a heating source for a film-forming target are the same as those in the first and second embodiments, and description thereof will be omitted.

The unwinding roll 302, the first guide roll 303, the first elastic roll 304, the second guide roll 305, the third guide roll 306, the fourth guide roll 307, the second elastic roll 308, and the winding roll 309 constitute a roll-to-roll mechanism. A film-forming target S is set in the roll-to-roll mechanism. The first guide roll 303 and the first elastic roll 304 constitute a first pinch roll 311, and the fourth guide roll 307 and the second elastic roll 308 constitute a second pinch roll 312.

In the film-forming apparatus 300, the film-forming target S unwound from the unwinding roll 302 is wound by the winding roll 309 via the first pinch roll 311, the second guide roll 305, the third guide roll 306, and the second pinch roll 312. The film-forming target S is sandwiched by the first pinch roll 311 and by the second pinch roll 312.

The transport belt 310 is disposed downward, in the vertical direction, of the film-forming target S between the first pinch roll 311 and the second pinch roll 312, and the film-forming target S comes into contact with the transport belt 310 by gravity. The transport belt 310 transports the film-forming target S by the rotation of the belt.

Film-formation onto the film-forming target S is performed in the film-forming area between the first pinch roll 311 and the second pinch roll 312. Since the film-forming target S is transported by the transport belt 310, a tensile force by the roll-to-roll mechanism is not applied. Therefore, deformation (plastic deformation and twinning deformation) of the film-forming target S due to a tensile force does not occur, and the film quality can be prevented from being deteriorated due to the deformation of the film-forming target S.

Modified Example 2

Figure 8:
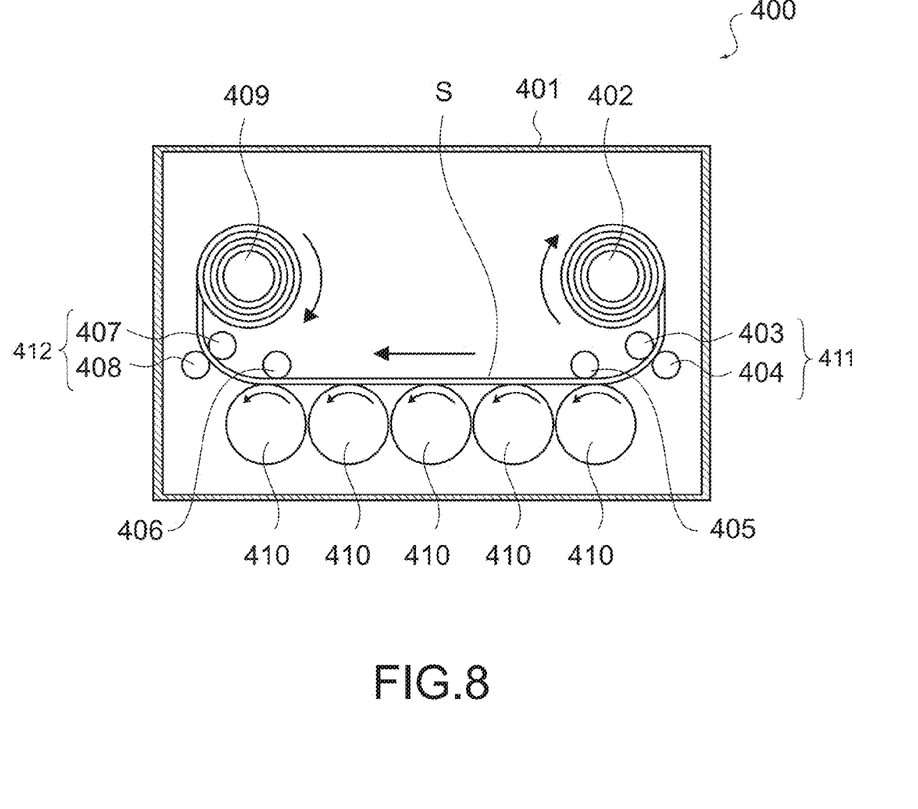
FIG. 8 is a schematic diagram showing a configuration of a film-forming apparatus according to Modified Example 2 of the present disclosure.

FIG. 8 is a schematic diagram showing a film-forming apparatus 400 according to Modified Example 2. As shown in FIG. 8, the film-forming apparatus 400 includes a chamber 401, an unwinding roll 402, a first guide roll 403, a first elastic roll 404, a second guide roll 405, a third guide roll 406, a fourth guide roll 407, a second elastic roll 408, a winding roll 409, and a transfer roll 410. It should be noted that a gas supply system, a vacuum evacuation system, and a heating source for a film-forming target are the same as those in the first and second embodiments, and description thereof will be omitted.

The unwinding roll 402, the first guide roll 403, the first elastic roll 404, the second guide roll 405, the third guide roll 406, the fourth guide roll 407, the second elastic roll 408, and the winding roll 409 constitute a roll-to-roll mechanism. A film-forming target S is set in the roll-to-roll mechanism. The first guide roll 403 and the first elastic roll 404 constitute a first pinch roll 411, and the fourth guide roll 407 and the second elastic roll 408 constitute a second pinch roll 412.

In the film-forming apparatus 400, the film-forming target S unwound from the unwinding roll 402 is wound by the winding roll 409 via the first pinch roll 411, the second guide roll 405, the third guide roll 406, and the second pinch roll 412. The film-forming target S is sandwiched by the first pinch roll 411 and by the second pinch roll 412.

One or a plurality of transfer rolls 410 are disposed downward, in the vertical direction, of the film-forming target S between the first pinch roll 411 and the second pinch roll 412, and the film-forming target S comes into contact with the transfer roll 410 by gravity. The transfer roll 410 transports the film-forming target S by the rotation of the belt.

Film-formation onto the film-forming target S is performed in the film-forming area between the first pinch roll 411 and the second pinch roll 412. Since the film-forming target S is transported by the transfer roll 410, a tensile force by the roll-to-roll mechanism is not applied. Therefore, deformation (plastic deformation and twinning deformation) of the film-forming target S due to a tensile force does not occur, and the film quality can be prevented from being deteriorated due to the deformation of the film-forming target S.

The film-forming apparatus according to each of the embodiments of the present disclosure is not limited to a film-forming apparatus used for forming a graphene film and can be a film-forming apparatus used for forming various thin films. The film-forming method therefor is also not limited to CVD (Chemical Vapor Deposition) and can be PVD (Physical Vapor Deposition) or other film-forming methods in which a film formation can be performed using the roll-to-roll mechanism.

It should be noted that the present disclosure can take the following configurations.

(1)
A film-forming apparatus, including:
a roll-to-roll mechanism configured to transport a film-forming target and including a tensile force relaxation unit configured to relax a tensile force applied to the transported film-forming target; and
a heating unit configured to heat the film-forming target transported by the roll-to-roll mechanism.

(2)
The film-forming apparatus according to (1), in which
the tensile force relaxation unit includes a pinch roll configured to sandwich the film-forming target.

(3)
The film-forming apparatus according to (1) or (2), in which
the pinch roll includes
a guide roll configured to guide transport of the film-forming target, and
an elastic roll having a roll surface made of an elastic material, and
the elastic roll is pushed by the guide roll such that the film-forming target is sandwiched between the elastic roll and the guide roll.

(4)
The film-forming apparatus according to any one of (1) to (3), in which
the tensile force relaxation unit includes a multiple-stage roll including a plurality of rolls.

(5)
The film-forming apparatus according to any one of (1) to (4), further including a slack detection sensor configured to detect an amount of slack of the film-forming target, wherein
the tensile force relaxation unit is configured to adjust the tensile force applied to the film-forming target in accordance with an output of the slack detection sensor.

(6)
The film-forming apparatus according to any one of (1) to (5), in which
the tensile force relaxation unit is configured to relax the tensile force applied to the film-forming target to be equal to or smaller than a tensile force at which twinning deformation occurs in the film-forming target.

(7)
The film-forming apparatus according to any one of (1) to (6), in which
the film-forming target includes a metallic foil containing copper, and
the tensile force relaxation unit is configured to relax the tensile force applied to the film-forming target to be smaller than 1 MPa.

(8)
The film-forming apparatus according to any one of (1) to (7), further including a film-forming material supply unit configured to supply a carbon source substance containing carbon to the film-forming target heated by the heating unit.

(9)
A film-forming method, including:
setting a film-forming target in a roll-to-roll mechanism;
transporting the film-forming target by the roll-to-roll mechanism;
supplying a film-forming material to the film-forming target; and
heating the film-forming target in a state in which a tensile force applied to the film-forming target is relaxed by the roll-to-roll mechanism.

(10)
The film-forming method according to (9), in which
the heating the film-forming target is performed after transport of the film-forming target by the roll-to-roll mechanism is stopped and the tensile force is relaxed.

The present application contains subject matter related to that disclosed in Japanese Priority Patent Application JP 2012-124321 filed in the Japan Patent Office on May 31, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST 100, 200, 300, 400 Film-forming apparatus
102, 202, 302, 402 Unwinding roll
103, 104, 203, 205, 303, 307, 403, 407 Guide roll
105, 204, 206, 303, 304, 308, 404, 408 Elastic roll
110, 214, 215, 311, 312, 411, 412 Pinch roll
106, 209, 309, 409 Winding roll
107, 210 Current source
211 Slack detection sensor

The invention claimed is:
1. An apparatus, comprising:
a roll-to-roll mechanism configured to transport a film target and includes a tensile force relaxation unit configured to relax a first tensile force applied to the transported film target; and
a heating unit configured to heat the film target transported by the roll-to-roll mechanism,
wherein the roll to roll mechanism comprises a first guide roll and a second guide roll,
wherein the transported film target is resistance-heated by the heating unit by a current supplied to the film target through an area of the film target between the first guide roll and the second guide roll of the roll-to-roll mechanism, and
wherein the tensile force relaxation unit comprises a pinch roll that includes the second guide roll and an elastic roll.

2. The apparatus according to claim 1, wherein
the second guide roll is configured to guide transport of the film target, and
the elastic roll has a roll surface made of an elastic material, and
wherein the elastic roll is pushed by the second guide roll to sandwich the film target between the elastic roll and the second guide roll.

3. The apparatus according to claim 1, wherein
the tensile force relaxation unit includes a multiple-stage roll that comprises a plurality of rolls.

4. The apparatus according to claim 1, further comprising a slack detection sensor configured to detect an amount of slack of the film target, wherein
the tensile force relaxation unit is further configured to adjust the first tensile force based on an output of the slack detection sensor.

5. The apparatus according to claim 1, wherein
the tensile force relaxation unit is further configured to relax the first tensile force to be equal to or smaller than a second tensile force at which twinning deformation occurs in the film target.

6. The apparatus according to claim 5, wherein
the film target includes a metallic foil that comprises copper, and
the tensile force relaxation unit is further configured to relax the first tensile force to be smaller than 1 MPa.

7. The apparatus according to claim 6, further comprising a film material supply unit configured to supply a carbon source substance to the film target heated by the heating unit, wherein the carbon source substance comprises carbon.

8. The apparatus to claim 1, wherein the elastic roll comprises a roll surface made of a silicon material.

* * * * *